United States Patent
Galan et al.

(10) Patent No.: US 9,809,876 B2
(45) Date of Patent: Nov. 7, 2017

(54) ENDBLOCK FOR ROTATABLE TARGET WITH ELECTRICAL CONNECTION BETWEEN COLLECTOR AND ROTOR AT PRESSURE LESS THAN ATMOSPHERIC PRESSURE

(71) Applicant: Centre Luxembourgeois de Recherches pour le Verre et la Ceramique (C.R.V.C) SaRL, Dudelange (LU)

(72) Inventors: Gilbert Galan, Dudelange (LU); Jean-Philippe Uselding, Habay-la-Neuve (BE); Guy Comans, Neufchateau (BE); Marcel Schloremberg, Habay-la-Neuve (BE)

(73) Assignee: Centre Luxembourgeois de Recherches pour le Verre et la Ceramique (C.R.V.C.) SaRL, Luxembourg (LU)

( * ) Notice: Subject to any disclaimer, the term of this patent is extended or adjusted under 35 U.S.C. 154(b) by 512 days.

(21) Appl. No.: 14/153,658

(22) Filed: Jan. 13, 2014

(65) Prior Publication Data

US 2015/0197847 A1 Jul. 16, 2015

(51) Int. Cl.
*C23C 14/34* (2006.01)
*H01J 37/34* (2006.01)
*H01J 37/32* (2006.01)

(52) U.S. Cl.
CPC ........ *C23C 14/34* (2013.01); *H01J 37/32816* (2013.01); *H01J 37/342* (2013.01); *H01J 37/3405* (2013.01); *H01J 37/3411* (2013.01); *H01J 37/3417* (2013.01); *H01J 37/3435* (2013.01); *H01J 37/3497* (2013.01); *H01J 2237/332* (2013.01)

(58) Field of Classification Search
CPC ............................ H01J 37/342; H01J 37/3435
See application file for complete search history.

(56) References Cited

U.S. PATENT DOCUMENTS

| | | | |
|---|---|---|---|
| 5,096,562 A | 3/1992 | Boozenny et al. | |
| 5,620,577 A * | 4/1997 | Taylor ................ | C23C 14/3407 204/298.11 |
| 5,725,746 A * | 3/1998 | Dickey ............... | C23C 14/3407 204/298.11 |
| 6,736,948 B2 | 5/2004 | Barrett | |
| 7,513,141 B2 | 4/2009 | Rietzel | |
| 7,824,528 B2 | 11/2010 | Dellaert et al. | |
| 8,192,598 B2 | 6/2012 | Heinrich et al. | |
| 8,337,681 B2 | 12/2012 | Heinrich et al. | |
| 8,562,799 B2 | 10/2013 | Dellaert et al. | |
| 2005/0006233 A1 | 1/2005 | Barrett | |
| 2005/0053481 A1 | 3/2005 | Rietzel | |

(Continued)

FOREIGN PATENT DOCUMENTS

| | | |
|---|---|---|
| EP | 1 365 436 | 11/2003 |
| WO | WO 2008/154397 | 12/2008 |

*Primary Examiner* — Jason M Berman
(74) *Attorney, Agent, or Firm* — Nixon & Vanderhye P.C.

(57) ABSTRACT

An endblock for a rotatable sputtering target, such as a rotatable magnetron sputtering target, is provided. A sputtering apparatus, including one or more such endblock(s), includes locating the electrical contact(s) (e.g., brush(es)) between the collector and rotor in the endblock(s) in an area under vacuum (as opposed to in an area at atmospheric pressure).

13 Claims, 3 Drawing Sheets

(56) References Cited

U.S. PATENT DOCUMENTS

| | | |
|---|---|---|
| 2005/0178662 A1 | 8/2005 | Wurczinger |
| 2006/0231394 A1 | 10/2006 | Barrett |
| 2007/0144891 A1 | 6/2007 | Henrich et al. |
| 2009/0095055 A1 | 4/2009 | Rietzel |
| 2011/0024284 A1* | 2/2011 | Schloremberg ....... H01J 37/342 204/192.12 |
| 2011/0240465 A1 | 10/2011 | Schnappenberger |
| 2012/0097526 A1 | 4/2012 | Madocks et al. |

* cited by examiner

ENDBLOCK FOR ROTATABLE TARGET WITH ELECTRICAL CONNECTION BETWEEN COLLECTOR AND ROTOR AT PRESSURE LESS THAN ATMOSPHERIC PRESSURE

Example embodiments of this invention relate to an endblock for a rotatable sputtering target such as a rotatable magnetron sputtering target. A sputtering apparatus design, including an endblock design, includes locating the electrical contact(s) (e.g., brush(es)) between the collector and rotor in an area under vacuum (as opposed to in an area at atmospheric pressure) which has been found to provide for significant advantages.

BACKGROUND AND SUMMARY OF THE INVENTION

Sputtering is known in the art as a technique for depositing layers or coatings onto substrates such as glass substrates. For example, a low-emissivity (low-E) coating can be deposited onto a glass substrate by successively sputter-depositing a plurality of different layers onto the substrate. As an example, a low-E coating may include the following layers in this order: glass substrate/$SnO_2$/ZnO/Ag/ZnO, where the Ag layer is an IR reflecting layer and the metal oxide layers are dielectric layers. In this example, one or more tin (Sn) targets may be used to sputter-deposit the base layer of $SnO_2$, one or more zinc (Zn) inclusive targets may be used to sputter-deposit the next layer of ZnO, an Ag target may be used to sputter-deposit the Ag layer, and so forth. The sputtering of each target is performed in a chamber housing a gaseous atmosphere (e.g., a mixture of Ar and O gases in the Sn and/or Zn target atmosphere(s)). Example references discussing sputtering and devices used therefore include U.S. Pat. Nos. 8,192,598, 6,736,948, 5,427,665, 5,725,746 and 2004/0163943, the entire disclosures of which are all hereby incorporated herein by reference.

A sputtering target (e.g., cylindrical rotatable magnetron sputtering target) typically includes a cathode tube within which is a magnet array. The cathode tube is often made of stainless steel. The target material is typically formed on the tube by spraying, casting or pressing it onto the outer surface of the stainless steel cathode tube. Often, a bonding or backing layer is provided between the tube and the target to improve bonding of the target material to the tube. Each sputtering chamber includes one or more targets, and thus includes one or more of these cathode tubes. The cathode tube(s) may be held at a negative potential (e.g., −200 to −1500 V), and may be sputtered when rotating. When a target is rotating, ions from the sputtering gas discharge are accelerated into the target and dislodge, or sputter off, atoms of the target material. These atoms, in turn, together with the gas form the appropriate compound (e.g., tin oxide) that is directed to the substrate in order to form a thin film or layer of the same on the substrate.

In addition to the quality of the coating the magnetron deposits upon the substrate, dependability and serviceability of the magnetron is an issue. This is not an easy task taking into account the constraints of the process that is involved. A cylindrical magnetron sputters material from a rotating target tube onto the substrate as it is transported past the target. In order to coat such a large piece of glass or the like the target tube can be up to 15 feet in length and up to 6 inches or more in diameter and can weigh up to 1700 pounds for example. Another complication is that the sputtering actually erodes the target tube during the sputtering process, so the target tube is constantly changing shape during its serviceable lifetime. And the sputtering process can require that an extremely high AC or DC power (e.g., 800 Amps DC, 150 kW AC) be supplied to the target in certain instances. This power transfer creates significant heat in the target tube and the surrounding components, which must be cooled in order to assure proper performance and to avoid failure of the magnetron. Thus, it is known to pump water through the center of the rotating target tube at high pressure and flow rate to cool the target.

FIG. 1 is a side plan view of a rotating sputtering target and conventional endblock. FIG. 1 illustrates that the rotating target 1 is supported on one end by an endblock 3. The endblock 3 may be supported by and/or attached to a wall or ceiling 5 of a sputtering chamber 8 in a sputtering apparatus 7. Outside of the sputtering chamber(s) 8, the sputtering apparatus is at atmospheric pressure 9. In FIG. 1, reference numeral 9 indicates areas at atmospheric pressure. Efficient and effective sputtering requires that the sputtering process take place in a vacuum or a reduced pressure relative to atmosphere—in FIG. 1 the chamber 8 (other than the endblock 3) is under vacuum and thus is at pressure less than atmospheric pressure. The rotating target system is designed to have a robust sealing system, including seals 11 and 12 to prevent pressure or vacuum leaks between the low pressure areas 8 and the atmospheric pressure areas 9.

Electrically conductive brushes 15 provide for electrical contact and thus a power connection between the collector and the rotor. In the conventional system of FIG. 1, the brushes 15 that provide the electrical power connection between the collector and rotor are located in an area 9 at atmospheric pressure.

It has surprisingly been found that a new design that includes locating the electrical contact(s) (e.g., brushes) between the collector and rotor in an area under vacuum (as opposed to in an area at atmospheric pressure as in conventional FIG. 1) provides for significant advantages over the conventional design. Moving the power connection between the rotor and collector to an area under vacuum (an area at a pressure less than atmospheric pressure), for example, allows for a structure where both the rotor and collector can be efficiently cooled (e.g., water cooled) which has surprisingly been found to allow the sputtering rate to be improved (e.g., up to a 20% improvement in sputtering rate has surprisingly been found compared to the conventional FIG. 1 design). A rotating sputtering target, such as a magnetron sputtering target, is often supported by two endblocks—one at each end of the target. One or both of the endblocks for supporting a rotating target may be designed in accordance with example embodiments of this invention.

In example embodiments of this invention, there is provided a sputtering apparatus comprising: at least one endblock for supporting an end of a cylindrical rotatable sputtering target, the endblock including a fixed conductive collector, and a rotatable conductive rotor for rotating with the cylindrical sputtering target during sputtering operations; the endblock further including an electrical power transfer structure (e.g., conductive brush(es)) located between the fixed conductive collector and the rotatable rotor for allowing electrical power to be transferred from the collector to the rotor; a first cooling area through which liquid flows for cooling the fixed conductive collector, the first cooling area being located around at least a portion of the fixed conductive collector and being substantially concentric with the fixed conductive collector; a second cooling area, separate from the first cooling area, through which liquid flows for cooling the rotor and target, the second cooling area being at least partially surrounded by the rotor, and wherein the liquid in the second cooling area flows in at least a direction that is substantially parallel to an axis about which the target and rotor are to rotate; wherein the liquid in the first cooling area flows around the axis about which the target and rotor are to rotate; and wherein the electrical power transfer structure, the rotor, and the collector are each located (partially or fully) in an area under vacuum having pressure less than atmospheric pressure (e.g., so that there is no significant difference in pressure therebetween).

Unless otherwise stated or indicated, "fixed" as used herein when referring to an element being "fixed" means that the element at issue does not rotate together with the rotor or target tube during sputtering operations.

DETAILED DESCRIPTION OF EXAMPLE EMBODIMENTS OF THE INVENTION

Figure 1:
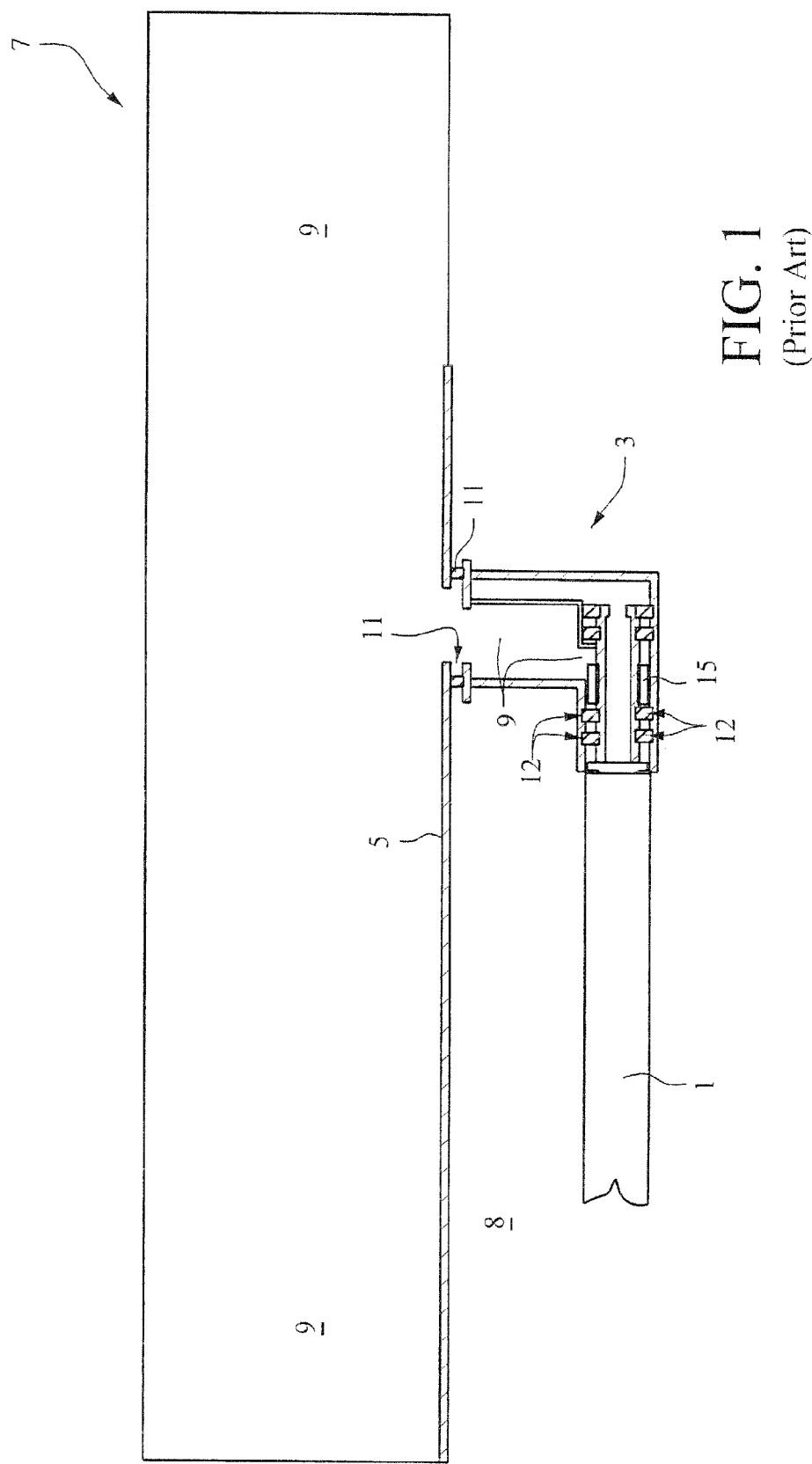
FIG. 1 is a side plan view of a rotating sputtering target and conventional endblock.

Referring now more particularly to the accompanying drawings in which like reference numerals indicate like parts throughout the figures.

Figure 2:
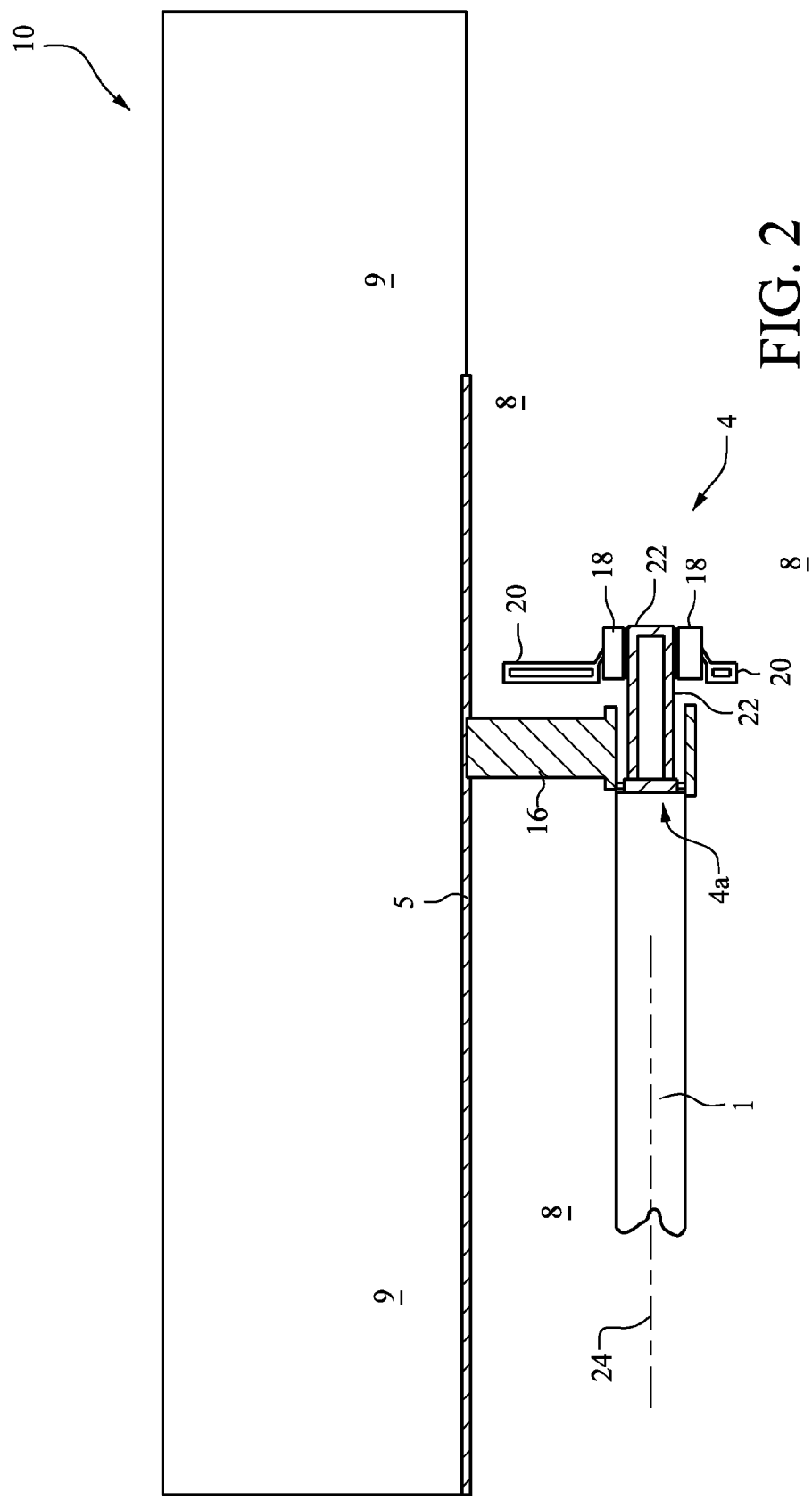
FIG. 2 is a side plan view of a rotating sputtering target and endblock according to an example embodiment of this invention.
Figure 3:
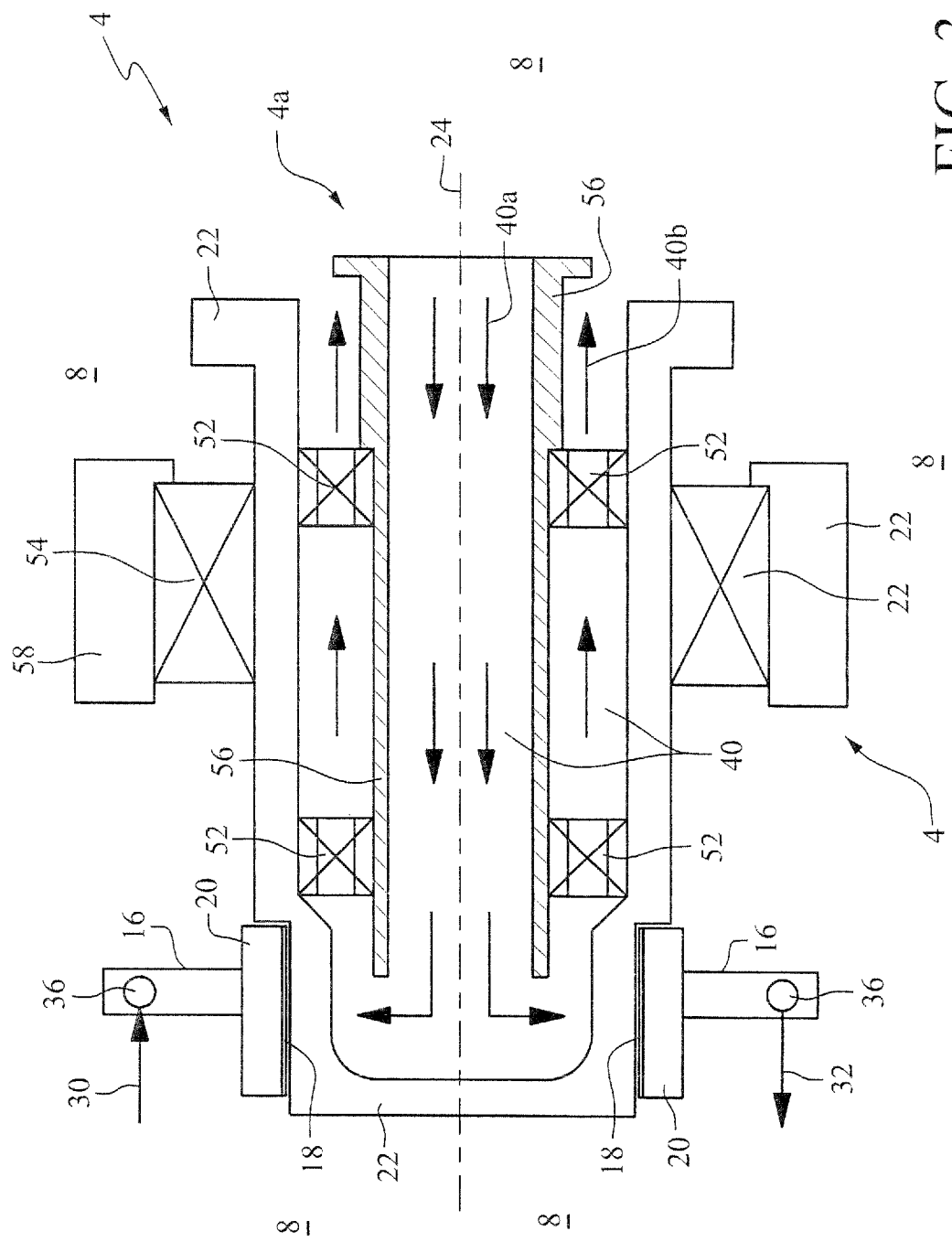
FIG. 3 is a cross sectional view of the endblock of FIG. 2 according to an example embodiment of this invention.

FIG. 2 is a side plan view of a rotating sputtering target and endblock. The endblock 4 is for a cathode revolver that is to be placed in a sputtering apparatus prior to sputtering operations, and then utilized in the sputtering apparatus during sputtering operation. FIG. 2 illustrates that the rotating cylindrical magnetron target 1 is supported at one end by an endblock 4 designed according to an example embodiment of this invention. And FIG. 3 is a cross sectional view of the endblock 4 of FIG. 2. The endblock 4 may be supported by and/or attached to a wall and/or ceiling 5 of a sputtering chamber 8 in a sputtering apparatus 10 via an endblock support 16. In other preferred embodiments, the endblock 4 may be mounted on and supported by a cathode revolver via support 16 for selective use in sputtering apparatus such as the cathode revolver disclosed in U.S. application Ser. No. 12/461,130, the disclosure of which is hereby incorporated herein by reference. Outside of the sputtering chamber(s) 8, the sputtering apparatus is at atmospheric pressure 9. In FIGS. 2-3, reference numeral 9 indicates areas at atmospheric pressure which are generally areas above the ceiling 5 and/or outside of the chamber 8. Efficient and effective sputtering requires that the sputtering process take place in a vacuum or a reduced pressure relative to atmosphere—in FIGS. 2-3 the sputtering chamber 8 (including the endblock 4) is under vacuum and thus is at pressure less than atmospheric pressure. The rotating target system is designed to have a robust sealing system, including seals to prevent pressure or vacuum leaks between the low pressure areas 8 and the atmospheric pressure areas 9.

Electrically conductive brushes/contacts 18 provide for electrical contact and thus a power connection between the fixed conductive collector 20 and the rotating conductive rotor 22 in order to transfer large amounts of energy from the collector 20 to the rotor 22 and target tube/cathode 1 needed for the sputtering process. Power (current and/or voltage) is applied to or through the conductive endblock support 16 and travels through the conductive collector 20 which is in electrical communication (directly or indirectly) with the conductive support 16. Thus, the fixed endblock support 16 is in electrical communication with the fixed collector 20 and power is provided to the collector 20 from exterior the chamber 8 via fixed endblock support 16. The power is then transferred form the fixed conductive collector 20 to the rotating conductive rotor 22 via contact(s) such as contact brushes 18 or the like, with the power then being provided from the rotor 22 to the target tube assembly.

In contrast with FIG. 1, in FIGS. 2-3 the contact brushes 18 that provide the electrical power connection between the collector 20 and rotor 22 are located in an area 8 under vacuum (in an area at pressure less than atmospheric pressure). The entire illustrated area 8 shown in FIG. 3, under the ceiling 5, is under vacuum and is thus at pressure less than atmospheric pressure. The rotor 22 rotates along with the sputtering target 1 about longitudinal axis 24 which extends through the target 1 and the endblock 4, whereas the collector 20 is fixed in place and does not rotate with the target 1. The rotor 22 may be of a single piece design, or may be made up of multiple pieces. Inner bearings 52 and outer bearings 54, each concentric with the rotor 22 and spindle tube 56 so as to all have a common axis 24, allow the rotor 22 to rotate about axis 24 relative to fixed spindle tube 56 and fixed support 58 which at least partially surrounds the rotor 22. The spindle tube 56 is fixed in place relative to the rotor, and the spindle tube 56 is preferably fixed (directly or indirectly) to the magnet bar structure (not shown) in the target tube. The target 1 is connected to and located at the inboard side 4a of the endblock 4. Another similar or different endblock (not shown) may support the other end of the rotatable target 1. In certain example embodiments, the endblock 4 shown in FIGS. 2-3 may be considered the driving endblock for supporting one end of the rotatable target 1, whereas a different endblock (e.g., without a collector) such as a cooling endblock supporting the opposite end of the target 1. In certain example embodiment, the cooling liquid (e.g., water) input 30 and output 32 for the collector cooling area are located in the driving endblock 4 shown in FIGS. 2-3, whereas the cooling liquid (e.g., water) input and output for the cooling area 40 are located in the other endblock (not shown) at the opposite end of the target 1.

It has surprisingly been found that the design of FIGS. 2-3 that includes locating the electrical contact(s) (e.g., brushes) 18 between the collector 20 and rotor 22 in an area 8 entirely under vacuum (as opposed to in an area 9 at atmospheric pressure as in conventional FIG. 1) provides for significant advantages over the conventional design of FIG. 1. Moving the power connection between the rotor 22 and collector 22 to an area 8 under vacuum (an area at a pressure less than atmospheric pressure), for example, allows for a structure where both the rotor 22 and collector 20 can be efficiently cooled (e.g., water cooled) which has surprisingly been found to allow the sputtering rate to be improved (e.g., up to a 20% improvement in sputtering rate has surprisingly been found compared to the conventional FIG. 1 design).

A water inlet 30 and water outlet 32 are provided for allowing water to be input and output from an area for cooling the collector 20. The cooling area 36 through which the cooling water flows and is circulated for cooling the collector 20 surrounds axis 24 and at least part of the rotor 22, and is located within the collector and/or so as to surround the collector 20 as shown in FIGS. 2-3. The inlet 30, outlet 32, and cooling area 36 are fixed and do not rotate with the rotor. A separate cooling area 40 surrounded by the rotor 22 is provided for allowing water to flow in order to cool the rotor 22 and target 1, this cooling area 40 including an inner portion 40*a* and an outer portion 40*b* that surrounds the inner portion 40*a*. Cooling water flows in one direction in inner portion 40*a* and in the opposite direction in outer portion 40*b*, as shown by arrows in FIG. 3. As shown in FIG. 3, a portion of the rotor 22 may be located between the cooling area 36 and the rotor cooling area 40. The water in collector cooling area 36 generally flows in different directions than does the water in rotor cooling area 40 (40*a*, 40*b*). The target 1 is typically horizontally aligned relative to the ground and rotates about axis 24, and the liquid in areas 40*a* and 40*b* preferably flows in respective directions that are substantially parallel to axis 24.

In example embodiments of this invention, there is provided a sputtering apparatus comprising: at least one endblock 4 for supporting an end of a cylindrical rotatable sputtering target 1, the endblock 4 including a fixed conductive collector 20, and a rotatable conductive rotor 22 for rotating with the cylindrical sputtering target during sputtering operations; the endblock 4 further including an electrical power transfer structure (e.g., conductive brush(es)) 18 located between the fixed conductive collector 20 and the rotatable rotor 22 for allowing electrical power to be transferred from the collector 20 to the rotor 22; a first cooling area 36 through which liquid flows for cooling the fixed conductive collector 20, the first cooling area 36 being located around at least a portion of the fixed conductive collector 20 and being substantially concentric with the fixed conductive collector 20; a second cooling area 40, separate from the first cooling area 36, through which liquid flows for cooling the rotor 22 and target 1, the second cooling area 40 being at least partially surrounded by the rotor 22, and wherein the liquid in the second cooling area 40 flows in at least a direction(s) that is substantially parallel to an axis 24 about which the target 1 and rotor 22 are to rotate; wherein the liquid in the first cooling area 36 flows around the axis 24 about which the target 1 and rotor 22 are to rotate; and wherein the electrical power transfer structure 18, the rotor 22, and the collector 20 are each located (partially or fully) in an area 8 under vacuum having pressure less than atmospheric pressure (e.g., so that there is no significant difference in pressure therebetween) during sputtering operations.

In the sputtering apparatus of the immediately preceding paragraph, the electrical power transfer structure 18 may be made up of one or more conductive brush(es) or any other suitable conductive structure/material.

In the sputtering apparatus of any of the preceding two paragraphs, the entirety of the electrical power transfer structure 18 and the entirety of the rotor 22 may each be located in the area under vacuum having pressure less than atmospheric pressure.

In the sputtering apparatus of any of the preceding three paragraphs, the target 1 may be located entirely in the area under vacuum having pressure less than atmospheric pressure.

In the sputtering apparatus of any of the preceding four paragraphs, the entirety of the collector 20 may be located in the area under vacuum having pressure less than atmospheric pressure.

In the sputtering apparatus of any of the preceding five paragraphs, a cooling liquid inlet and a cooling liquid outlet for the first cooling area may be provided in or proximate said (first) endblock, and wherein a cooling liquid inlet and a cooling liquid outlet for the second cooling area may be provided in or proximate another (second) endblock that is provided at an end of the target opposite the end at which said (first) endblock including the collector is located.

In the sputtering apparatus of any of the preceding six paragraphs, the liquid in the first cooling area need not mix with the liquid in the second cooling area (the first and second cooling areas are not in fluid communication with each other). Alternatively, in other example embodiments, the liquid in the first and second cooling areas may mix and the first and second cooling areas may be in fluid communication with each other.

In the sputtering apparatus of any of the preceding seven paragraphs, the liquid in the first cooling area and/or the liquid in the second cooling area may comprise water.

In the sputtering apparatus of any of the preceding eight paragraphs, the endblock and target may be mounted on a cathode revolver for selective movement and use in sputtering operations in the sputtering apparatus. Alternatively, the endblock and target need not be mounted on such a cathode revolver, and may instead for example be mounted from a ceiling of a sputtering chamber without any intervening revolver.

In certain example embodiments of this invention, there is provided an endblock for supporting a rotatable sputtering target in a sputtering apparatus, the endblock comprising: a fixed conductive collector; a rotatable conductive rotor for rotating with the rotatable sputtering target during sputtering operations; an electrical power transfer structure located between the fixed conductive collector and the rotatable rotor at least for allowing electrical power to be transferred from the collector to the rotor; and wherein the electrical power transfer structure, the rotor, and the collector are each adapted to be located in an area under vacuum having pressure less than atmospheric pressure during sputtering operations.

The endblock of the immediately preceding paragraph may further include a first cooling area through which liquid flows for cooling the fixed conductive collector, the first cooling area being located around at least a portion of the fixed conductive collector and being substantially concentric with the fixed conductive collector.

The endblock of any of the immediately preceding two paragraphs may further include a second cooling area through which liquid flows for cooling the rotor and target, the second cooling area being at least partially surrounded by the rotor, and wherein the liquid in the second cooling area flows in at least a direction that is substantially parallel to an axis about which the target and rotor are to rotate.

In the endblock of any of the immediately preceding three paragraphs, the liquid in the first cooling area may flow around the axis about which the target and rotor are to rotate.

In the endblock of any of the preceding four paragraphs, the electrical power transfer structure may include or be made up of one or more conductive brush(es).

In the endblock of any of the preceding five paragraphs, the entirety of the electrical power transfer structure and the entirety of the rotor may be adapted to be located in the area under vacuum having pressure less than atmospheric pressure during sputtering operations.

In the endblock of any of the preceding six paragraphs, first and second cooling areas need not be in fluid communication with each other.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A sputtering apparatus comprising:
   at least one endblock for supporting an end of a cylindrical rotatable sputtering target, the endblock including a fixed conductive collector and a rotatable conductive rotor for rotating with the cylindrical sputtering target during sputtering operations;
   the endblock further including an electrical power transfer structure located between the fixed conductive collector and the rotatable rotor for allowing electrical power to be transferred from the collector to the rotor;
   a first cooling area through which liquid flows for cooling the fixed conductive collector, the first cooling area being located around at least a portion of the fixed conductive collector and being substantially concentric with the fixed conductive collector;
   a second cooling area, separate from the first cooling area, through which liquid flows for cooling the rotor and target, the second cooling area being at least partially surrounded by the rotor, and wherein the liquid in the second cooling area flows in at least a direction that is substantially parallel to an axis about which the target and rotor are to rotate;
   wherein the electrical power transfer structure comprises a conductive brush that when viewed in cross section from a point of view perpendicular to the axis is located between at least the first and second cooling areas along a line drawn perpendicular to the axis, and wherein the brush is located closer to the axis than is the first cooling area;
   wherein the liquid in the first cooling area flows around the axis about which the target and rotor are to rotate; and
   wherein the electrical power transfer structure, the rotor, and the collector are each located in an area under vacuum having pressure less than atmospheric pressure during sputtering operations.

2. The sputtering apparatus of claim 1, wherein the electrical power transfer structure is made up of one or more conductive brush(es).

3. The sputtering apparatus of claim 1, where the entirety of the electrical power transfer structure and the entirety of the rotor are each located in the area under vacuum having pressure less than atmospheric pressure.

4. The sputtering apparatus of claim 1, wherein the target is also to be located entirely in the area under vacuum having pressure less than atmospheric pressure.

5. The sputtering apparatus of claim 1, wherein the entirety of the collector is located in the area under vacuum having pressure less than atmospheric pressure.

6. The sputtering apparatus of claim 1, wherein an endblock support supports the endblock from a ceiling of a sputtering chamber of the sputtering apparatus.

7. The sputtering apparatus of claim 1, wherein the liquid in the first cooling area does not mix with the liquid in the second cooling area.

8. The sputtering apparatus of claim 1, wherein the liquid in the first cooling area comprises water.

9. The sputtering apparatus of claim 1, wherein the liquid in the second cooling area comprises water.

10. The sputtering apparatus of claim 1, wherein the endblock and target are mounted on a cathode revolver for selective movement and use in sputtering operations in the sputtering apparatus.

11. The sputtering apparatus of claim 1, wherein a cooling liquid inlet and a cooling liquid outlet for the first cooling area are provided in or proximate said endblock, and wherein a cooling liquid inlet and a cooling liquid outlet for the second cooling area are provided in or proximate another endblock that is provided at an end of the target opposite the end at which said endblock including the collector is located.

12. The sputtering apparatus of claim 1, wherein bearings rotatably supporting the rotor are located inboard of the brush and the first cooling area, so that when viewed from above the bearings are located between the brush and the sputtering target.

13. The sputtering apparatus of claim 1, wherein the conductive brush is concentric with the first and second cooling areas.

* * * * *